United States Patent
Yoshida

(10) Patent No.: US 10,797,693 B2
(45) Date of Patent: Oct. 6, 2020

(54) DRIVE CIRCUIT, POWER MODULE AND ELECTRIC POWER CONVERSION SYSTEM

(71) Applicant: Mitsubishi Electric Corporation, Tokyo (JP)

(72) Inventor: Hiroshi Yoshida, Fukuoka (JP)

(73) Assignee: Mitsubishi Electric Corporation, Tokyo (JP)

(*) Notice: Subject to any disclaimer, the term of this patent is extended or adjusted under 35 U.S.C. 154(b) by 0 days.

(21) Appl. No.: 16/171,770

(22) Filed: Oct. 26, 2018

(65) Prior Publication Data

US 2019/0326903 A1    Oct. 24, 2019

(30) Foreign Application Priority Data

Apr. 24, 2018    (JP) .................. 2018-083168

(51) Int. Cl.
| | |
|---|---|
| H03K 17/56 | (2006.01) |
| H03K 19/0175 | (2006.01) |
| H02M 5/458 | (2006.01) |
| H03K 3/037 | (2006.01) |
| H02M 1/00 | (2006.01) |

(52) U.S. Cl.
CPC ............ H03K 17/56 (2013.01); H02M 5/458 (2013.01); H03K 3/0375 (2013.01); H03K 19/017509 (2013.01); *H02M 2001/0054* (2013.01); *H03K 2217/0081* (2013.01)

(58) Field of Classification Search
CPC ...... H03K 17/56; H03K 17/567; H03K 17/58; H03K 17/60–64; H03K 17/66–70; H03K 17/72–735; H03K 3/0375; H03K 19/017509; H03K 19/017518; H03K 19/017527; H03K 2217/0081; H02M 2001/0054; H02M 2001/0058
See application file for complete search history.

(56) References Cited

U.S. PATENT DOCUMENTS

| | | | |
|---|---|---|---|
| 10,425,069 B2 * | 9/2019 | Oka | H03K 4/56 |
| 2008/0130183 A1 * | 6/2008 | Kawashima | H02M 5/458 |
| | | | 361/79 |
| 2011/0148376 A1 * | 6/2011 | Xu | H03K 17/165 |
| | | | 323/282 |
| 2018/0138902 A1 * | 5/2018 | Lu | H03K 17/14 |

FOREIGN PATENT DOCUMENTS

JP    2008-193717 A    8/2008

* cited by examiner

*Primary Examiner* — Patrick C Chen
(74) *Attorney, Agent, or Firm* — Studebaker & Brackett PC

(57) ABSTRACT

A drive circuit includes: a control circuit providing control voltage to a control terminal of a switching device in accordance with input signal; and a capacitor having one end connected to a high side main terminal of the switching device, wherein the control circuit increases an output current capacity of the control circuit when the input signal becomes ON signal and voltage at the other end of the capacitor drops.

5 Claims, 5 Drawing Sheets

| $\overline{S}$ | $\overline{R}$ | $\overline{Q_{n+1}}$ |
|---|---|---|
| L | L | H |
| L | H | L |
| H | L | H |
| H | H | $Q_n$ |

DRIVE CIRCUIT, POWER MODULE AND ELECTRIC POWER CONVERSION SYSTEM

BACKGROUND OF THE INVENTION

Field

The present invention relates to a drive circuit, a power module and an electric power conversion system.

Background

In a power module, a control circuit turns on or off a switching device such as an IGBT or MOSFET by biasing the gate of the switching device in accordance with an input signal. Generally, when a high side switching device cascode-connected is ON, a low side switching device is OFF, and the collector of the low side switching device is at high potential that is substantially equal to that of a high voltage power supply voltage. When, upon receiving an ON signal from the control circuit in this state, the gate potential of the low side switching device reaches a threshold, the collector and the emitter of the low side switching device gradually conduct to each other and the collector voltage starts to drop. In this state, the high side switching device is already in the OFF state. The gate-collector capacitance increases by the Miller effect, so that the gate voltage remains constant until the collector voltage reduces to a certain value. This period is called the Miller period. When the collector voltage drop settles down, the gate voltage rises again. A low gate voltage increases the collector-emitter impedance, resulting in increased switching loss. One way to reduce the switching loss is to enhance the output current capacity of the control circuit to shorten the Miller period. However, there is another problem in that the collector current flows rapidly when the switching device turns on from the OFF state, whereby the switching noise is increased.

Various techniques have been devised to reduce the switching loss without causing an increase in the switching noise. For example, in one disclosed method, the output current capacity of the control circuit is increased when the switching device is turned on and the collector voltage drops to a predetermined reference value or lower (see, for example, Japanese Patent Application Laid-open No. 2008-193717, FIG. 1 and FIG. 12).

SUMMARY

According to the conventional method, the collector voltage of the switching device is divided by resistors and input to the control circuit. Therefore, the output current capacity is not changed until the collector voltage drops to a certain level. Thus the switching loss could only be reduced to a limited extent. Moreover, current keeps flowing through the resistor during the period in which the switching device is OFF and the collector voltage is high. When the power supply voltage is as high as 600 V or 1200 V, the power consumed by the resistor becomes an issue. To reduce the current value, the resistance value need to be increased. This, however, will increase the CR time constant and lower the response speed, as well as reduce the variation range of the divided voltage, which compromises the detection sensibility. Accordingly, the switching loss could not be reduced sufficiently.

The present invention was made to solve the problem described above and it is an object of the invention to provide a drive circuit, a power module and an electric power conversion system that can sufficiently reduce switching loss while minimizing power consumption and avoiding an increase in switching noise.

A drive circuit according to the present invention includes: a control circuit providing control voltage to a control terminal of a switching device in accordance with input signal; and a capacitor having one end connected to a high side main terminal of the switching device, wherein the control circuit increases an output current capacity of the control circuit when the input signal becomes ON signal and voltage at the other end of the capacitor drops.

In the present invention, one end of the capacitor is connected to a high side main terminal of the switching device, and the control circuit increases an output current capacity of the control circuit when the input signal becomes ON signal and voltage at the other end of the capacitor drops. Accordingly, the switching loss can be sufficiently reduced while minimizing power consumption and avoiding an increase in switching noise.

Other and further objects, features and advantages of the invention will appear more fully from the following description.

DESCRIPTION OF EMBODIMENTS

A drive circuit, a power module and an electric power conversion system according to the embodiments of the present invention will be described with reference to the drawings. The same components will be denoted by the same symbols, and the repeated description thereof may be omitted.

First Embodiment

Figure 1:
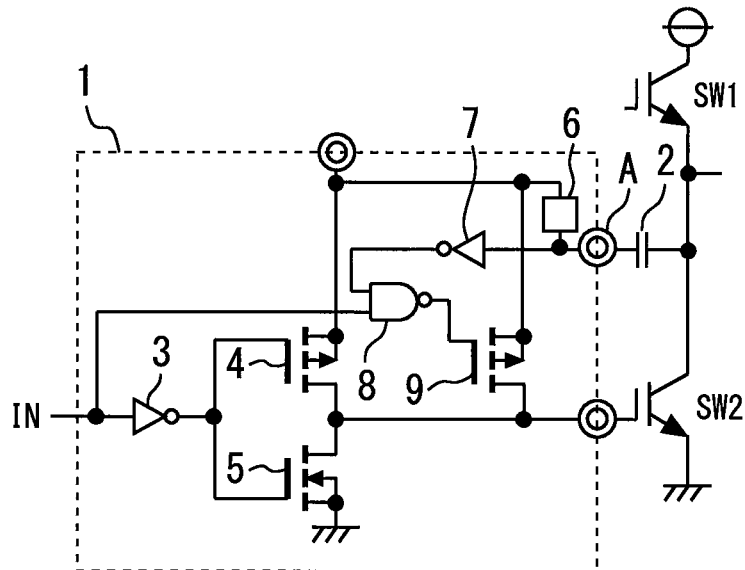
FIG. 1 is a circuit diagram illustrating a power module according to a first embodiment.

FIG. 1 is a circuit diagram illustrating a power module according to a first embodiment. A high side switching device SW1 and a low side switching device SW2 are cascode-connected. The switching devices SW1 and SW2 are IGBTs. A control circuit 1 provides gate voltage to the gate of the switching device SW2 in accordance with input signal N. One end of a capacitor 2 is connected to the collector of the switching device SW2, while the other end is connected to point A of the control circuit 1. Here, the gate of the switching device SW2 corresponds to a control terminal, the gate voltage corresponds to control voltage, and the collector corresponds to a high side main terminal.

In the control circuit 1, an inverter 3, a PMOS transistor 4, and an NMOS transistor 5 generate voltage to be supplied to the gate of the switching device SW2 in accordance with input signal IN. A pull-up resistor 6 raises the voltage at point A, i.e., voltage at the other end of the capacitor 2, to the power supply voltage (high level). An inverter 7 and an NAND circuit 8 configure a detection circuit that detects the input signal IN and the voltage at the other end of the capacitor 2. A PMOS transistor 9 is a switching unit that switches the output current capacity of the control circuit 1 in accordance with the output of the NAND circuit 8.

Figure 2:
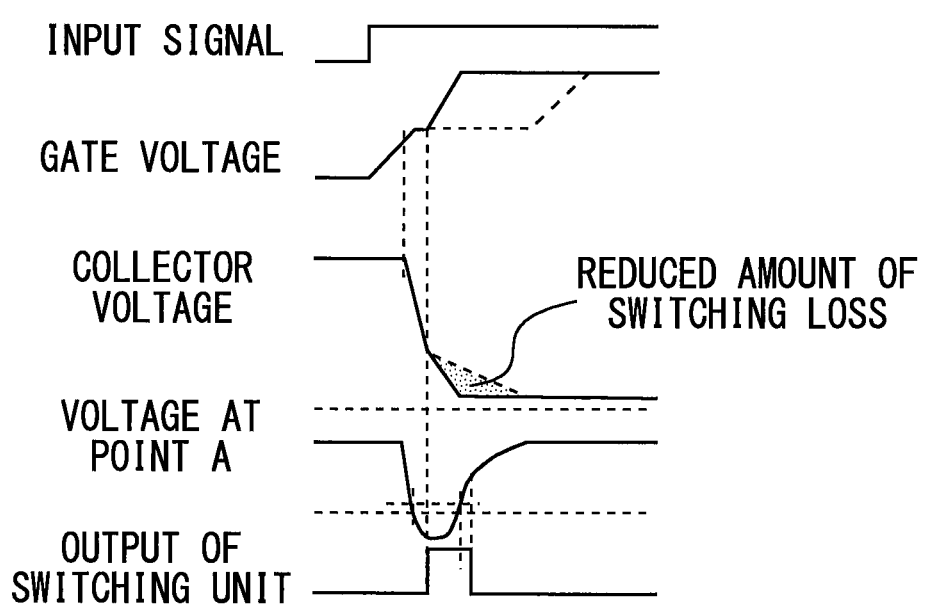
FIG. 2 is a time chart showing the operation of the power module according to the first embodiment.

FIG. 2 is a time chart showing the operation of the power module according to the first embodiment. The control circuit 1 raises the gate voltage of the switching device SW2 when ON signal is applied as input signal. When the gate voltage of the switching device SW2 reaches a threshold and the switching device SW2 starts to turn on, the collector voltage starts to drop from the main power supply level (600 to 1200 V) to ground potential (0 V). A differentiation circuit configured by the capacitor 2 and the pull-up resistor 6 detects this change and causes the voltage at point A to drop at substantially the same timing as the collector voltage. Thus the voltage at point A changes from high level to low level. When the collector voltage stops changing after that, the voltage at point A returns to high level.

The control circuit 1 increases its output current capacity when the input signal becomes ON signal and the voltage at the other end of the capacitor 2 drops to below a predetermined value, namely to the low level. This enables a highly efficient increase of the gate voltage of the switching device SW2 during the Miller period of the switching device SW2, whereby the switching loss can be sufficiently reduced. The painted part in the drawing indicates the amount of switching loss reduced by the effect of this embodiment.

Since the output current capacity of the control circuit 1 is increased after the input signal becomes ON signal, there will be no rapid flow of collector current when the switching device SW2 turns from OFF to ON. Thus, the switching noise does not increase to an extent that it may cause a problem. Power consumption can be reduced as compared to when the collector voltage is divided by resistors and input to the control circuit 1. Accordingly, the switching loss can be sufficiently reduced while minimizing power consumption and avoiding an increase in switching noise.

Instead of the capacitor 2, a junction capacitance of a diode, or a drain-gate capacitance of a MOSFET may be used. With one of these incorporated in the control circuit 1, the same effects can be achieved.

Second Embodiment

Figure 3:
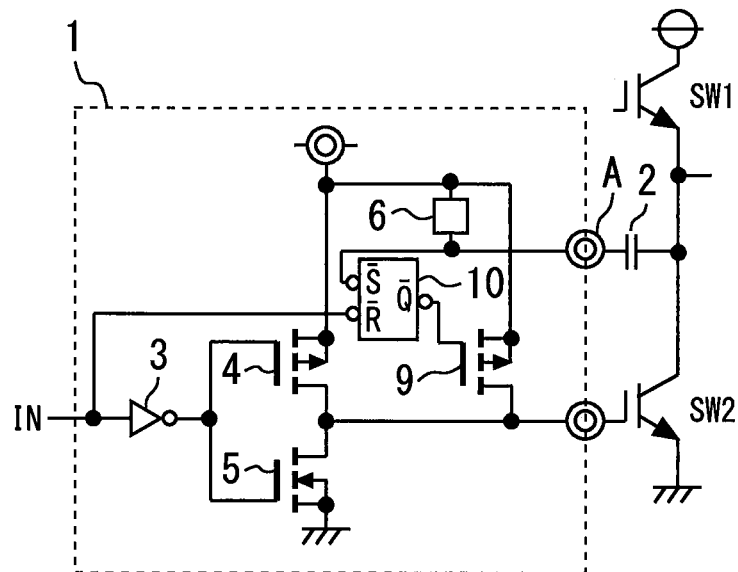
FIG. 3 is a circuit diagram illustrating a power module according to a second embodiment.
Figure 4:
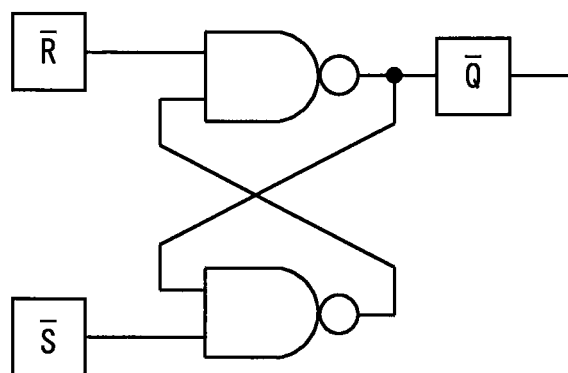
FIG. 4 is a circuit diagram illustrating a flip-flop circuit.

FIG. 3 is a circuit diagram illustrating a power module according to a second embodiment. FIG. 4 is a circuit diagram illustrating a flip-flop circuit. In this embodiment, a flip-flop circuit 10 is used as a detection circuit. Voltage at the other end of the capacitor 2 is input to the inverted set input $\overline{S}$ of the flip-flop circuit 10, and the input signal IN is input to the inverted reset input $\overline{R}$ of the flip-flop circuit 10. The PMOS transistor 9 switches the output current capacity of the control circuit 1 in accordance with the output from the inverted output $\overline{Q}$ of the flip-flop circuit 10.

Figure 5:
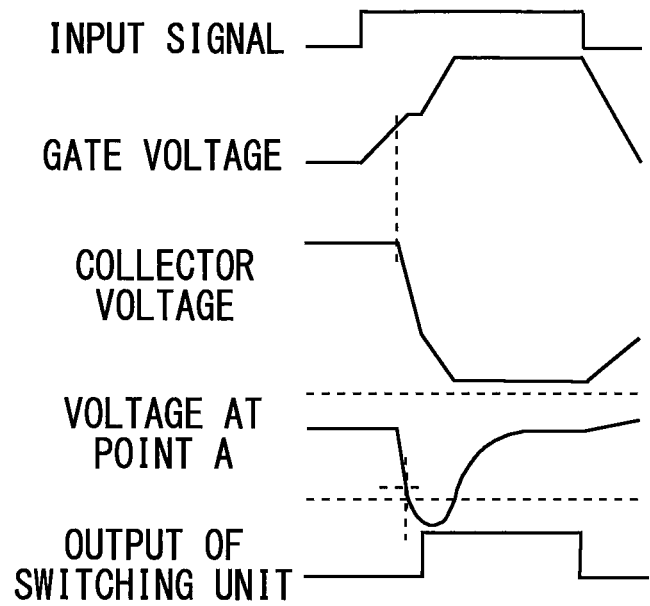
FIG. 5 is a time chart showing the operation of the power module according to the second embodiment.

FIG. 5 is a time chart showing the operation of the power module according to the second embodiment. The collector voltage input via the capacitor 2 is a transient signal. This signal is converted to a DC signal by the flip-flop circuit 10. Thus the control circuit 1 can maintain the high output current capacity even when the collector voltage change settles down so that the voltage at point A returns to its initial value and the signal is lost in the switching process. As the output current capacity is switched over in a more stable manner, the switching loss can be reduced more effectively.

Figure 6:
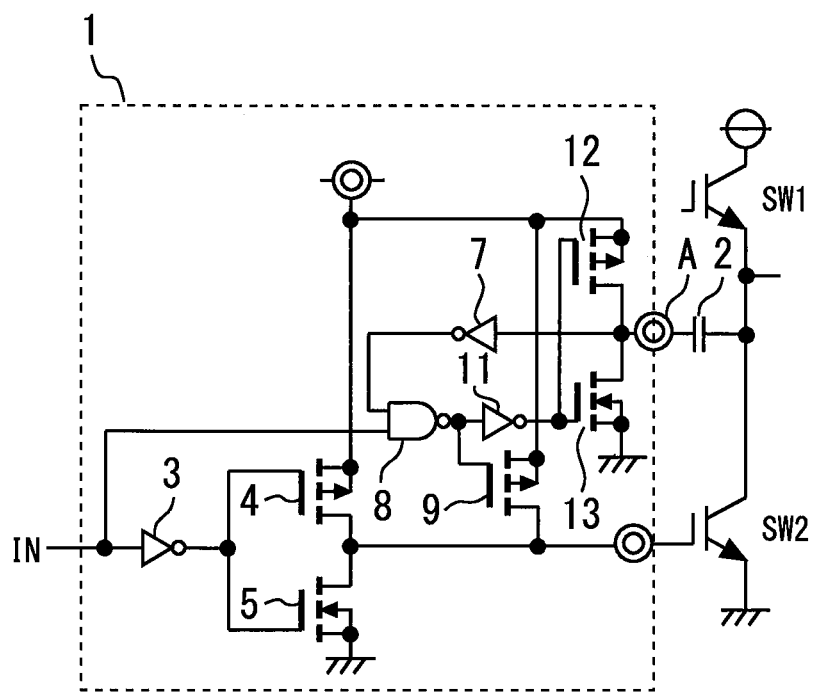
FIG. 6 is a circuit diagram illustrating a variation example of the power module according to the second embodiment.

FIG. 6 is a circuit diagram illustrating a variation example of the power module according to the second embodiment. Instead of the pull-up resistor 6 of the first embodiment, an inverter 11, a PMOS transistor 12, and an NMOS transistor 13 are used. The PMOS transistor 12 is connected between a power supply terminal and point A, while the NMOS transistor 13 is connected between point A and reference voltage. The inverter 11 inverts the output of the NAND circuit 8 to control these transistors. In this configuration, too, similarly to the second embodiment, the collector voltage input via the capacitor 2 is converted to a DC signal and the similar effects can be achieved.

Third Embodiment

Figure 7:
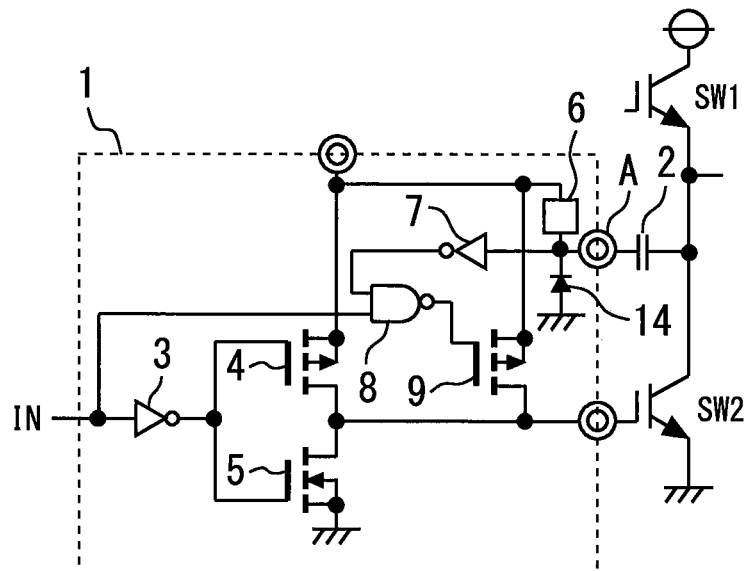
FIG. 7 is a circuit diagram illustrating a power module according to a third embodiment.

FIG. 7 is a circuit diagram illustrating a power module according to a third embodiment. A diode 14 is added to the configuration of the first embodiment as a clamp circuit. The cathode of the diode 14 is connected to point A, while the anode is connected to the reference voltage. The diode 14 clamps the voltage at the other end of the capacitor 2. A MOS transistor or a resistor device may be used instead of the diode 14.

Figure 8:
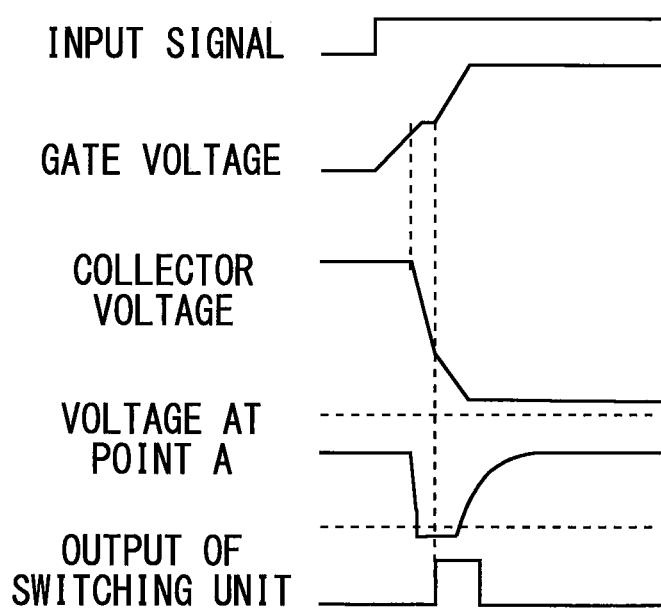
FIG. 8 is a time chart showing the operation of the power module according to the third embodiment.

FIG. 8 is a time chart showing the operation of the power module according to the third embodiment. When the collector voltage starts to drop from the high level with the start of the switching, the potential at point A also reduces via the capacitor 2. In the first embodiment, depending on the capacitance of the capacitor 2, or the collector voltage drop speed, the potential at point A may decrease to below the reference voltage of the control circuit 1. Generally, the control circuit 1 is constructed based on a precondition that the voltage is higher than the reference voltage at any point. Therefore, the circuit may malfunction if there is a point where the voltage is lower than the reference voltage. In this embodiment, the diode 14 is provided as a clamp circuit. Therefore, the potential at point A remains within the range of operating voltage of the clamp circuit and does not reduce to below the reference voltage of the control circuit 1, and thus malfunctioning of the control circuit 1 can be prevented. Also, the clamp circuit can prevent an excessive voltage from being applied to the control circuit 1 at the time of switching.

Fourth Embodiment

Figure 9:
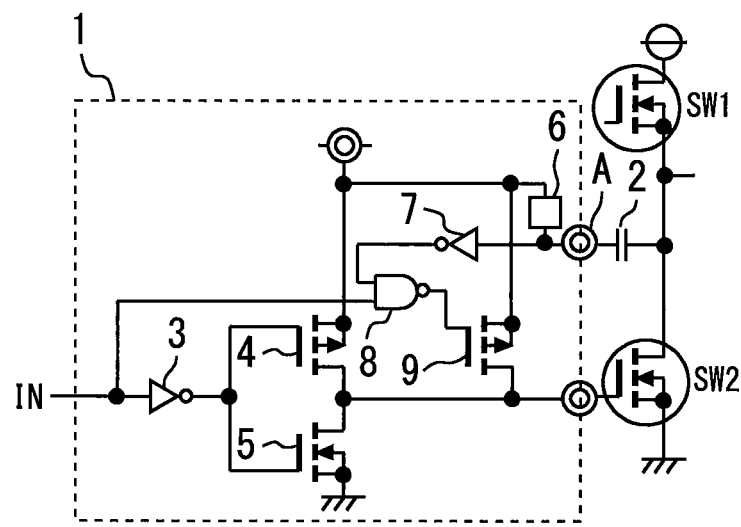
FIG. 9 is a circuit diagram illustrating a power module according to a fourth embodiment.

FIG. 9 is a circuit diagram illustrating a power module according to a fourth embodiment. In the embodiment, the switching devices SW1 and SW2 are MOSFETs formed of a wide-bandgap semiconductor having a bandgap wider than that of silicon. The wide-bandgap semiconductor is, for example, a silicon carbide, a gallium-nitride-based material, or diamond. The switching devices SW1 and SW2 formed of such a wide-bandgap semiconductor tend to have a faster switching speed and a larger switching loss than the switching devices formed of silicon. Therefore, it is more desirable to apply the present invention to the control of the switching devices SW1 and SW2 formed of a wide-bandgap semiconductor. Both the switching devices SW1 and SW2 are desirably formed of a wide-bandgap semiconductor. However, only one of the switching devices SW1 and SW2 may be formed of a wide-bandgap semiconductor. Also in this case, the advantageous effects described in this embodiment can be obtained.

Fifth Embodiment

In this embodiment, the power module according to the fourth embodiment is applied to an electric power conversion system. Although the present invention is not limited to a specific electric power conversion system, a case where the present invention is applied to a three-phase inverter will be described below.

Figure 10:
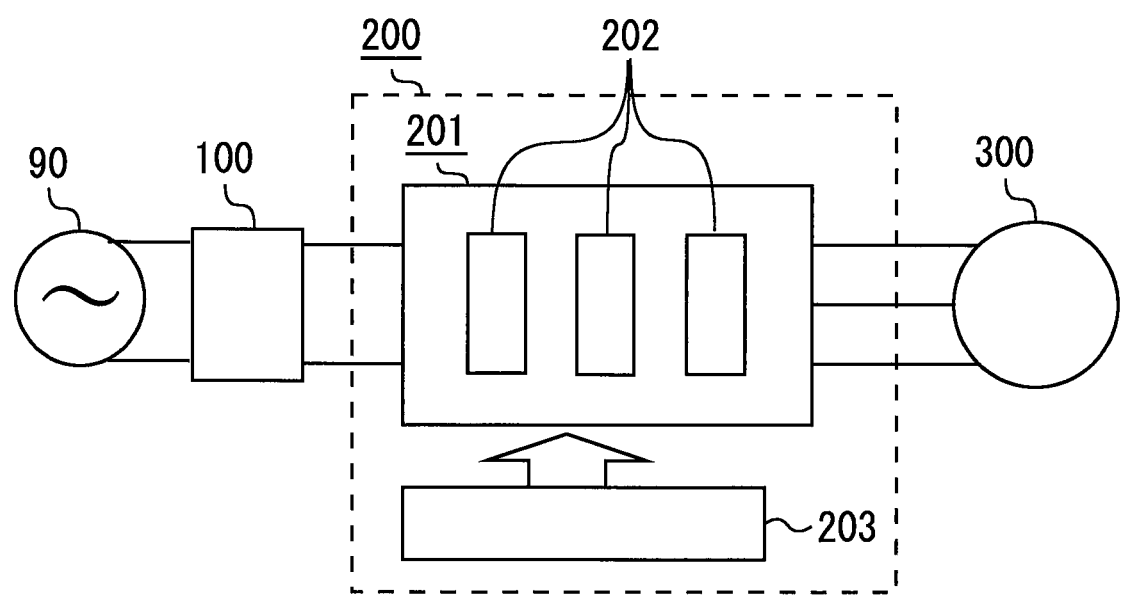
FIG. 10 is a block diagram illustrating a configuration of an electric power conversion system to which the electric power conversion device according to the fifth embodiment is applied.

FIG. 10 is a block diagram illustrating a configuration of an electric power conversion system to which the electric power conversion device according to the fifth embodiment is applied. This electric power conversion system includes a commercial power supply 90, a convertor 100, an electric power conversion device 200, and a load 300. The converter 100 converts AC power supplied from the commercial power supply 90 into DC power and supplies the DC power to the electric power conversion device 200. The converter 100 can be composed of various components. For example, the converter 100 can be typically composed of a rectifier circuit constituted by a diode bridge or an AC/DC converter. Alternatively, the converter 100 may include a DC/DC converter that converts DC power to predetermined power.

The electric power conversion device 200 is a three-phase inverter connected to a node between the converter 100 and the load 300, converts DC power supplied from the converter 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, an industrial robot, an elevator, or an air-conditioner.

The electric power conversion device 200 will be described in detail below. The main conversion circuit 201 includes a switching device. When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices. As the switching elements of the main conversion circuit 201, the power modules 202 according to the above-described first to fourth embodiments are used for three phases. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a control circuit that drives each switching device. The control circuit may be incorporated in the power module 202 as described in first to fourth embodiments. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the input signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can, be controlled by a PWM control for modulating the ON period of each switching device depending on the voltage to be output. Further, the control circuit 203 outputs an input signal to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the input signal.

In the electric power conversion device according to this embodiment, relatively high power of 600 to 1200 V, several A to several hundred A is handled. In such an electric power conversion device, switching noise tends to increase, so it is more desirable to use the drive circuit of this embodiment.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-083168, filed on Apr. 24, 2018 including specification, claims, drawings and summary, on which the Convention priority of the present application is based, is incorporated herein by reference in its entirety.

The invention claimed is:
1. A drive circuit comprising:
 a control circuit providing control voltage to a control terminal of a switching device in accordance with input signal; and
 a capacitor having one end connected to a high side main terminal of the switching device, wherein the control circuit increases an output current capacity of the control circuit when the input signal becomes ON signal and voltage at the other end of the capacitor drops, wherein the control circuit includes a detection circuit, in which each of the input signal and the voltage at the other end of the capacitor is inputted, and the detection circuit outputs an output signal in accordance with the received input signal and the voltage at the other end of the capacitor, wherein the control circuit further includes a switching unit that switches the output current capacity of the control circuit in accordance with the output signal of the detection circuit, and wherein the detection circuit is a flip-flop circuit.

2. The drive circuit according to claim 1, wherein the control circuit includes a clamp circuit that clamps the voltage at the other end of the capacitor.

3. A power module comprising:
a high side switching device and a low side switching device which are cascode-connected; and
the drive circuit according to claim 1 that controls the low side switching device.

4. The power module according to claim 3, wherein the high side switching device and the low side switching device are made of a wide-band-gap semiconductor.

5. An electric power conversion system comprising:
a converter converting AC power supplied from a commercial power supply into DC power, and
an inverter including the power module according to claim 3 and inverting the DC power into AC power of arbitrary frequency.

* * * * *